United States Patent [19]

Korb et al.

[11] Patent Number: 4,666,532

[45] Date of Patent: May 19, 1987

[54] DENUDING SILICON SUBSTRATES WITH OXYGEN AND HALOGEN

[75] Inventors: Harold W. Korb, Chesterfield; Claudia P. Reed, Troy; Roger W. Shaw, Kirkwood, all of Mo.

[73] Assignee: Monsanto Company, St. Louis, Mo.

[21] Appl. No.: 607,349

[22] Filed: May 4, 1984

[51] Int. Cl.$^4$ ......................................... H01L 21/324
[52] U.S. Cl. ................... 148/1.5; 148/33.4; 148/DIG. 60
[58] Field of Search ............... 29/571, 576 T; 148/33, 148/33.3, 33.4, 174, 175, 1.5, DIG. 60; 156/DIG. 66

[56] References Cited

U.S. PATENT DOCUMENTS

| | | | |
|---|---|---|---|
| 4,053,335 | 10/1977 | Hu | 148/175 X |
| 4,548,654 | 10/1985 | Tobin | 148/1.5 |
| 4,559,086 | 12/1985 | Hawkins | 148/1.5 |
| 4,597,804 | 7/1986 | Imaoka | 148/1.5 |
| 4,608,095 | 8/1986 | Hill | 148/33 |
| 4,608,096 | 8/1986 | Hill | 148/33 |

FOREIGN PATENT DOCUMENTS

| | | |
|---|---|---|
| 0030457 | 6/1981 | European Pat. Off. |
| 0066461 | 8/1982 | European Pat. Off. |
| 211737 | 12/1982 | Japan . |
| 0176241 | 9/1985 | Japan ............. 148/DIG. 60 |
| 2080780 | 2/1982 | United Kingdom . |

OTHER PUBLICATIONS

R. A. Craven, Oxygen Precipitation in Czochralski Silicon, 1981, pp. 254–271, Semiconductor Silicon 1981, The Electrochemical Society, Inc.

K. Kugimiya et al., Denuded Zone and Microdefect Formation in Czochralsky-Grown Silicon Wafers by Thermal Annealing, 1981, pp. 294–303, Semiconductor Silicon 1981, The Electrochemical Society, Inc.

R. W. Series et al., Influence of Precipitate Size and Capillarity Effects on the Surface Denuded Zone in Thermally Processed CZ-Silicon Wafers, 1981, pp. 304–312, Semiconductor Silicon 1981, The Electrochemical Society, Inc.

R. A. Craven et al., Internal Gettering in Silicon, 1981, pp. 55–61, Solid State Technology, Jul. 1981.

D. Huber et al., Precipitation Process Design for Denuded Zone Formation in CZ Silicon Wafers, 1983, pp. 137–143, Solid State Technology, Aug. 1983.

W. K. Tice et al., Precipitation of Oxygen and Intrinsic Gettering in Silicon, 1981, pp. 367–380, Defects in Semiconductors, North-Holland Inc.

P. Gaworzewski et al., On The Out-Diffusion of Oxygen from Silicon 1981, pp. 511–516, Phys. Stat. Sol (a) 67, 511 (1981).

H. Shiraki, Silicon Device Consideration on Grown-in and Process Induced Defect and Fault Annihilation, 1977, pp. 546–558 Semiconductor Silicon 1977, The Electrochemical Society, Inc.

Nagasawa et al., "A New Intrinsic Gettering Technique . . . ", Appl. Phys. Lett., 37(7), 1 Oct. 1980, pp. 622–624.

*Primary Examiner*—Olik Chaudhuri
*Attorney, Agent, or Firm*—Paul L. Passley

[57] ABSTRACT

Semiconductor substrate materials, such as silicon, useful in the manufacture of electronic devices, such as integrated circuits, having a 0.05 to 2.0 micron thick layer of polysilicon on the backside to improve gettering capabilities of defects, contaminants and impurities away from the active device region of the substrate are provided with a 10 to 40 micron deep region from the surface having reduced oxygen concentration. The oxygen denuding is accomplished by heating the substrate material at a temperature of 1050° to 1250° C. first in the presence of oxygen to break up oxygen nuclei, secondly in the presence of oxygen and halogen to permit stacking fault retrogrowth and oxygen outdiffusion, and thirdly in the presence of oxygen, nitrogen and/or argon.

4 Claims, No Drawings

DENUDING SILICON SUBSTRATES WITH OXYGEN AND HALOGEN

BACKGROUND OF THE INVENTION

1. Field of the Invention

This invention relates to the manufacture of electronic devices such as integrated circuits. Particularly, this invention relates to improved semiconductor substrate materials, such as silicon wafers, used in the manufacture of integrated circuit devices. Specifically, this invention is directed to semiconductor substrate materials having a region extending from the device formation surface into the bulk substrate substantially free of microdefects and with reduced oxygen concentration, and possessing enhanced ability for gettering deleterious impurities, contaminants and defects during device manufacture away from the region of device formation.

In the manufacture of integrated circuit devices on silicon wafers, the presence of and introduction of defects, contaminants and impurities on and near the device formation surface of the wafer creates excessive current leakages which greatly affect the yield of usable devices obtained. The art has recognized that the deleterious defects, contaminants and impurities can be to some extent relocated to non-harmful regions in the substrate material away from the device formation region. The methods and processes for diffusing and trapping the defects, contaminants and impurities away from the active device region both prior to and during device formation are termed gettering in the electronics industry and art. It is known in the art that precipitation of oxygen in substrate materials provides lattice strain which gives rise to dislocation loops and stacking faults that provide gettering sites.

Additionally, the art recognizes the desirability of depleting oxygen contained in the substrate material from a region of the bulk substrate at the surface where devices are formed as an aid in reducing defects which adversely effect the devices. The oxygen depletion in this region is referred to as denuding in the electronics industry and art.

2. Description of the Prior Art

Several techniques and processes for gettering in semiconductor materials to improve device yields have been disclosed in the art. Known gettering techniques and processes for semiconductor materials can be generally classified as based on external or internal means.

In copending U.S. application Ser. No. 466,249 filed Feb. 14, 1983 now U.S. Pat. No. 4,608,095, an improved silicon substrate having enhanced gettering ability for defects, contaminants and impurities is described and claimed. The improved substrate utilizes a layer of polysilicon on the backside of a bulk silicon substrate to provide external gettering means. The polysilicon layer also enhances the oxygen precipitation in the substrate which provides internal gettering ability. The combination of external polysilicon and internal oxygen gettering offers many advantages in the newer lower temperature device fabrication processes. The full teachings of this copending application for improved silicon substrates having a polysilicon layer formed on the backside are hereby incorporated herein.

Recently, UK patent application No. 2080780 was published which is directed to a multistep process wherein silicon slices are heated above 1100° C. for 4 to 16 hours to diffuse oxygen from the surface areas and form a denuded zone and then heated at 650°–850° C. for 14 to 16 hours to nucleate defects for providing gettering sites within the center portion of the bulk substrate. Also, European Patent Application No. 0066461 was recently published which is directed to a multistep process wherein silicon slices are first heated at a temperature from 1000°–1200° C. to remove oxygen from the front surface region and form a denuded zone, then heated at a temperature from 600°–1000° C. to form a nucleus of crystal defects below the oxygen reduced region and then heated at a temperature from 1050°–1150° C. to form only stacking faults beneath the oxygen reduced region for providing gettering sites. Another European Patent Application No. 0030457 discloses treating a wafer at 950° to 1300° C. in a non-oxidizing atmosphere to diffuse oxygen from the surface region and form a denuded zone and then heating at 600° to 800° C. to create a high density of defects in the interior of the wafer to provide gettering sites for impurities. In Japanese Kokai Pat. No. 57[1982]-211737 semiconductor substrates are prepared by first growing a 0.5–2.5 micron thick monocrystalline silicon layer on the back surface of the substrate at a temperature above 970° C. and then thermo oxidizing the substrate at about 1140° C. in a wet oxygen environment. This treatment is said to reduce surface defects on the front surface of the wafer.

With any gettering means, the active region of the substrate material where the devices are formed must be free of gettering sites. Thus, a zone about 5–75 microns and preferably about 10–20 microns in depth from the device surface of the wafer which is denuded of gettering sites must be created to prevent device yield loss from defect interference. The oxygen concentration in a substrate material can be reduced near the surface through outward diffusion at the process thermal conditions employed in device manufacture when the process temperatures are sufficiently high to favor out diffusion of oxygen from the substrate rather than precipitation of the oxygen within the substrate material.

With the rapidly advancing device manufacturing technology and particularly with respect to complex and lengthy processing steps, decreased processing temperatures and increased circuit density and total circuit size on a wafer, it has become apparent that improvements are needed in the perfection of the device surface region of substrates and in the gettering capabilities of the bulk substrates to cope with the increased requirements and provide gettering throughout the device processing steps in order to achieve an acceptable yield of good devices per wafer.

SUMMARY OF THE INVENTION

Typical objects of this invention are to provide:
1. a semiconductor substrate having an oxygen depleted surface region and improved gettering capabilities,
2. a semiconductor substrate having an oxygen denuded surface region and both internal and external gettering capabilities,
3. a semiconductor substrate which exhibits reduced defect formation in the active device region, and
4. a process for providing oxygen depletion from a surface region of a semiconductor substrate and enhanced oxygen precipitation below such surface region.

Other objects, characteristics and advantages of this invention will become apparent to those skilled in the art from this disclosure and appended claims.

In accordance with this invention, an improved semiconductor substrate is provided which exhibits reduced defect formation in the device surface region and enhanced gettering capabilities throughout device manufacturing cycles, imparts improved minority carrier lifetime and reduces yield loss of devices made due to deleterious defects, contaminants and impurities. The enhanced gettering capabilities are imparted to the semiconductor wafer through both internal means, i.e., oxygen precipitate content in the wafer and external means, i.e., applying a layer of polysilicon to the backside of the wafer as disclosed and claimed in copending U.S. application Ser. No. 466,249, filed Feb. 14, 1983 now U.S. Pat. No. 4,608,095. In said copending application it was found that the external polysilicon layer although reducing the depth of the oxygen denuded zone obtained in the wafer enhances the oxygen precipitation which provides an unexpected increase in sites for gettering of impurities and an unexpected increase in minority carrier lifetime as a function of the temperature employed in a particular device manufacturing process. The thickness of the polysilicon layer was found to effectively control the depth of the oxygen denuded zone formed and the degree of oxygen precipitated in the wafer.

We have now found a method of treating a polysilicon backside coated silicon substrate which provides an improved oxygen denuded surface zone while retaining the enhanced gettering capabilities of the substrate. The thickness of the polysilicon backside layer useful in this invention may vary over a wide range and a chosen thickness will depend upon the desired end application and characteristics desired. As noted in the noted copending application, a general thickness range is from 0.05 to 5.0 microns and in some applications is preferably 0.4 to 1.7 microns.

The improved oxygen denuding of this invention is accomplished by subjecting the polysilicon backside coated silicon substrate to a controlled temperature-atmosphere-time treating cycle. The denuding treatment of this invention is conducted prior to the device fabrication process to insure diffusion of oxygen from the surface region and dissolution of defects already present. The temperatures and atmospheres employed in the lower temperature device fabrication processes employed are insufficient to provide sufficient oxygen denuding and defect prevention in the surface region of the substrate.

In accordance with this invention, the critical feature is that the treating cycle includes at least one of the following steps: (1) heat at a temperature of from 1050° to 1250° C., preferably at 1100° to 1175° C. in an oxidizing atmosphere for up to 120 minutes, preferably 5 to 30 minutes, to break up oxygen nuclei and protect the substrate surface, (2) continue the heating in an oxidizing atmosphere containing a halogen for up to 320 minutes, preferably for 30 to 70 minutes to provide retrogrowth of stacking faults, (3) continue the heating in an oxygen and/or inert, such as nitrogen and/or argon, atmosphere for up to 600 minutes, preferably for 120 to 240 minutes to outdiffuse oxygen and break up oxygen nuclei and (4) continue heating in an inert atmosphere for up to 400 minutes, preferably 120 to 240 minutes to further outdiffuse oxygen and anneal the substrate.

Substrates treated in accordance with this invention provide an oxygen denuded zone of from 10 to 40 microns deep from the surface of the substrate after device manufacture having an oxygen precipitation density less than $10^6/cm^3$.

DESCRIPTION OF THE PREFERRED EMBODIMENTS

In the following Examples, a standard quartz tube furnace manufactured by Bruce Company, Model D-8-D4 with a 7351 DDC micro-controller is employed.

The depth of the oxygen denuded zone formed in the wafers after being subjected to simulated device temperature cycles and removal of the formed silicon dioxide layer is measured by either of two methods. The first involves lapping and polishing an edge of the wafer at a shallow angle of about 11°19' to provide a test surface approximately 1 cm. in length. The polished surface is then Wright etched. Under a 100X microscope the distance L from the top level of the prepared surface to the closest precipitate is measured. The denuded zone depth (DZ) is calculated as equal to $L \sin \phi + d$ where $\phi$ is the angle of bevel and d is the thickness of the top surface removed by the Wright etch. The second method utilizes a Philtec Model 2015 Sectioning Machine to cut and polish a groove into the wafer surface. The sample is then Wright etched and once again viewed in a 100X microscope. The denuded zone depth is then calculated as equal to $$[r^2 - (X/2 - P)^2]^{\frac{1}{2}} - [r^2 - (Y/2 - P)^2]^{\frac{1}{2}} + d$$

where r is the radius of the wheel used to cut the groove, X is the width of the region in the groove which exhibits precipitates, Y is the total width of the groove, P is a small correction factor supplied by the Philtec Co. to account for wheel distortion and d is the thickness removed by the Wright etch.

EXAMPLE 1

A number of N-type and P-type 100 mm diameter silicon wafers 500 microns thick and having an oxygen concentration of from 27 to 38 PPMA (ASTM F-121-79) and a polysilicon layer of approximately 1.6 micron thick on the backside prepared as described in copending U.S. application Ser. No. 466,249, filed Feb. 14, 1983 now U.S. Pat. No. 4,608,095, are subjected to the treating cycle set forth in Table I using a gas flow of 4000 ml/min.

TABLE I

| | DENUDING CYCLE | | |
|---|---|---|---|
| OPERATION | TEMPERATURE °C. | GASES (%) | TIME (MIN) |
| Sled loading | 900 | $N_2$—100 | |
| 1. Push | 900 | $N_2$—67 $O_2$—33 | 22 |
| 2. Equilibrate | 900 | $N_2$—67 $O_2$—33 | 15 |
| 3. Ramp (6°/min.) to | 1150 | $O_2$—100 | 42 |
| 4. Nuclei breakup | 1150 | $O_2$—100 | 20 |
| 5. SF retrogrowth, outdiffusion | 1150 | $N_2O$—94 $O_2$—5 HCl—1 | 50 |
| 6. Outdiffusion nuclei breakup | 1150 | $O_2$—100 | 100 |
| 7. Anneal, outdiffusion | 1150 | $N_2$—100 | 190 |
| 8. Ramp (4.5°/min) to | 850 | $N_2$—100 | 67 |
| 9. Equilbrate | 850 | $N_2$—100 | 15 |
| 10. Pull | 850 | $N_2$—100 | 22 |

TABLE I-continued

| OPERATION | DENUDING CYCLE | | |
|---|---|---|---|
| | TEMPERATURE °C. | GASES (%) | TIME (MIN) |
| 11. Cool | 850 | $N_2$—100 | 15 |

Groups of the treated wafers and standard wafers, as control, are subjected to one of the simulated device manufacturing temperature/atmosphere cycles set forth in Table II. All pushes and pulls are conducted with the furnace at 800° C.

TABLE II

| PUSH | TEMPERATURE °C. | TIME MINUTES | ATMOSPHERE | PULL |
|---|---|---|---|---|
| | | PROCESS SIMULATION CYCLES | | |
| | | SIMULATION A | | |
| X | 925 | 60 | $O_2 + H_2$ | X |
| X | 800 | 60 | $N_2$ | |
| | 950 | 260 | $O_2 + H_2$ | |
| | 1050 | 60 | $O_2$ | X |
| | | NMOS SIMULATION | | |
| X | 800 | 10 | $O_2 + N_2$ | |
| | 900 | 60 | $O_2$ | |
| | 975 | 240 | $O_2$ | |
| | 975 | 300 | $N_2$ | X |
| | | CMOS SIMULATION | | |
| X | 800 | 30 | $O_2 + N_2$ | |
| | 900 | 60 | $O_2$ | |
| | 1150 | 90 | $O_2$ | |
| | 1150 | 90 | $N_2$ | |
| | 1000 | 255 | $N_2$ | X |

The depth of the denuded zone formed near the surface of each test wafer and each control wafer for like process simulation cycle are determined as described above and averages of the results are reported in Table III.

TABLE III

| PROCESS SIMULATION | AVERAGE DENUDED ZONE DEPTH (MICRONS) |
|---|---|
| CONTROL (All simulation) | ~4 |
| Simulation A | 16.0 |
| NMOS Simulation | 18.0 |
| CMOS Simulation | 20.1 |

From the above data it is seen that at the processing conditions employed, the denuded zone depth of the wafers is increased by more than 4-fold compared to those control wafers which had not been treated with the denuding cycle of this invention. The approximately 4 micron depth zone before oxygen precipitate density appears in the control wafers is insufficient to prevent degradation of device characteristics caused by defect formation due to precipitated oxygen. On the other hand, the greater than 15 micron depth zone before precipitate density appears in the wafers treated in accordance with this invention is sufficient to prevent degradation of device characteristics due to precipitated oxygen induced defects. However, the presence of precipitate beyond the 15 micron depth after processing serves to provide gettering sites for impurities.

The average interstitial oxygen contents of control and denuded wafers determined initially, after the denuding treatment and after a device manufacture simulation, are given in Table IV.

TABLE IV

| Wafer | INTERSTITIAL OXYGEN (PPMA) | | |
|---|---|---|---|
| | Initial | Predenuded | Simulation |
| Control | 31.7 | — | 17.0 |
| Denuded | 31.7 | 27.3 | 18.1 |

From the above data, it is seen that approximately 14% of the oxygen is precipitated or diffused from the wafers treated in accordance with this invention and 34% of the interstitial oxygen remaining in the wafers is precipitated during the device manufacturing simulation.

From the above description and examples, it will be seen that the invention described herein provides a semiconductor substrate with a sufficient denuded zone to prevent device malfunction caused by defects at or near the surface and an increased oxygen precipitate density below the denuded zone for enhanced gettering of impurities from or near the surface. This combination of characteristics is advantageously obtained in accordance with this invention compared to the prior art in that the thermal treating is entirely conducted at a single temperature range. The prior art requires temperature variations in the denuding treatment to achieve oxygen diffusion from the surface region and oxygen including below the denuded surface region.

Although the foregoing description has emphasized prenuding with reference to specific embodiments, it is to be understood that changes and modifications in form and specific detail of the invention and utilization thereof may be made without departing from the spirit and scope of the invention and appended claims.

What is claimed is:

1. The method of forming a denuded zone below the front surface of a semiconductor substrate having a polysilicon layer on the back surface comprising heating said substrate at a temperature of from 1050° C. to 1250° C. first in the presence of oxygen to break up oxygen nuclei, secondly in the presence of oxygen and halogen to permit stacking fault retrogrowth and oxygen outdiffusion, and thirdly in the presence of an atmosphere selected from the group consisting of oxygen, nitrogen, argon and mixtures thereof to outdiffuse oxygen and break up oxygen nuclei from the zone below the front surface.

2. The method of claim 1 wherein said substrate is monocrystalline silicon and said polysilicon layer is 0.5 to 5.0 microns thick.

3. The method of claim 1 wherein said substrate is fourthly annealed at said temperature from 1050° C. to 1250° C. in an inert atmosphere.

4. The method of claim 1 wherein said heating is at a temperature of from 1100° to 1175° C.

* * * * *

UNITED STATES PATENT AND TRADEMARK OFFICE
CERTIFICATE OF CORRECTION

PATENT NO.  : 4,666,532
DATED       : May 19, 1987
INVENTOR(S) : Harold W. Korb et al It is certified that error appears in the above-identified patent and that said Letters Patent are hereby corrected as shown below:

Column 6, line 32 the word "including" should be --nucleating--.

Signed and Sealed this

First Day of March, 1988

*Attest:*

DONALD J. QUIGG

*Attesting Officer*     *Commissioner of Patents and Trademarks*